US008530856B2

(12) United States Patent
Spruck et al.

(10) Patent No.: US 8,530,856 B2
(45) Date of Patent: Sep. 10, 2013

(54) BEAM DEVICE SYSTEM COMPRISING A PARTICLE BEAM DEVICE AND AN OPTICAL MICROSCOPE

(75) Inventors: Bernd Spruck, Mögglingen (DE); Martin Edelmann, Aalen (DE); John Craven, Swavesey (GB); Robert Taylor, Cambridge (GB); Martin Kühner, Bad Klosterlausnitz (DE)

(73) Assignee: Carl Zeiss NTS Limited, Cambridge (GB)

( * ) Notice: Subject to any disclaimer, the term of this patent is extended or adjusted under 35 U.S.C. 154(b) by 312 days.

(21) Appl. No.: 12/734,613

(22) PCT Filed: Nov. 11, 2008

(86) PCT No.: PCT/EP2008/065299
§ 371 (c)(1),
(2), (4) Date: May 11, 2010

(87) PCT Pub. No.: WO2009/062929
PCT Pub. Date: May 22, 2009

(65) Prior Publication Data
US 2010/0224780 A1    Sep. 9, 2010

(30) Foreign Application Priority Data

Nov. 13, 2007   (EP) .................................... 07120619

(51) Int. Cl.
*H01J 37/26*    (2006.01)
*G21K 5/04*    (2006.01)

(52) U.S. Cl.
USPC ................. 250/440.11; 250/441.11; 250/310; 250/311; 250/396 R

(58) Field of Classification Search
USPC ............ 250/440.11, 310, 311, 396 R, 441.11
See application file for complete search history.

(56) References Cited

U.S. PATENT DOCUMENTS

| 2,243,403 A | 5/1941 | Ardenne |
|---|---|---|
| 4,440,475 A | 4/1984 | Colliaux |

(Continued)

FOREIGN PATENT DOCUMENTS

| JP | 60130043 A | 7/1985 |
|---|---|---|
| JP | S62 80952 A | 4/1987 |

(Continued)

OTHER PUBLICATIONS

Carl Zeiss SMT, Nano Technology Systems Division, "Move to a High Level of Open Architecture," Brochure, Zeiss Evo Series, published Apr. 2005, 27 pp.
Carl Zeiss SMT, Nano Technology Systems Division, "Your Developing Applications—Our Evo-Lived Solutions," Brochure, Zeiss Evo Series, published Aug. 2008, 28 pp.
National Institute of Mental Health (NIMH), "From Neuron to Synapse: 3D Visualization of Neuronal Structure Using Electron Tomography," Neuroinformatics, from http://www.nimh.nih.gov/neurinformatics/neuronnstruc.cfm, Jan. 9, 2006, 2 pp.

(Continued)

*Primary Examiner* — Nikita Wells
(74) *Attorney, Agent, or Firm* — Muirhead and Saturnelli, LLC

(57) ABSTRACT

A beam device, in particular a particle beam device, for analyzing an object is provided, as well as a system comprising a particle beam device and an optical microscope for optically analyzing an object. The beam device simplifies the exchange and reduces the time of the exchange of objects to be examined. The beam device includes at least one beam generator that generates a beam, at least one objective lens that focuses the beam on an object arranged in a holding element. The objective lens comprises at least one connecting element. The holding element may be connected to the connecting element so that the holding element is removable from the connecting element for modification of the object. Alternatively, the holding element may be mounted to a beam column.

44 Claims, 11 Drawing Sheets

(56) References Cited

U.S. PATENT DOCUMENTS

| | | | |
|---|---|---|---|
| 4,631,444 | A | 12/1986 | Cheever |
| 5,493,125 | A | 2/1996 | Okayama et al. |
| 6,365,898 | B1 | 4/2002 | Sudraud et al. |
| 6,872,956 | B2 | 3/2005 | Gnauck et al. |
| 6,989,542 | B2 | 1/2006 | Moses et al. |
| 6,992,300 | B2 * | 1/2006 | Moses et al. ............. 250/440.11 |
| 7,095,022 | B2 * | 8/2006 | Nakasuji et al. ............. 250/310 |
| 7,215,408 | B2 * | 5/2007 | Hamatani et al. ................ 355/52 |
| 7,230,242 | B2 | 6/2007 | Behar et al. |
| 7,307,792 | B2 * | 12/2007 | Spruck et al. ................. 359/630 |
| 2003/0047689 | A1 | 3/2003 | Kasai et al. |
| 2005/0236587 | A1 | 10/2005 | Kodama et al. |
| 2007/0125947 | A1 | 6/2007 | Sprinzak et al. |

FOREIGN PATENT DOCUMENTS

| | | |
|---|---|---|
| JP | 63174252 A | 7/1988 |
| JP | 8273578 A | 10/1996 |
| JP | 9129169 A | 5/1997 |
| JP | 2007292702 A | 11/2007 |
| WO | WO02/45125 A1 | 6/2002 |
| WO | WO03/104846 A2 | 12/2003 |
| WO | WO03/104848 A2 | 12/2003 |
| WO | WO2004/075209 A1 | 9/2004 |
| WO | WO2006/021961 A2 | 3/2006 |
| WO | WO 2006/051551 A2 | 5/2006 |

OTHER PUBLICATIONS

SPI Supplies, "Polymer Support Film Materials for TEM Grids," TEM Support Film Materials, from http://www.2spi.com/catalog/submat/sup_film.html, accessed on Jul. 30, 2010, 2 pp.

SPI Supplies, "SPI-Chem™ Formvar® Resin for Electron Microscopy," Formvar Resin for Electronc Microscopy and Other Applications, SPI Supplies, from TEM Support Film Materials, from http://www.2spi.com/catalog/submat/sup_film3.html, accessed on Jul. 30, 2010, 3 pp.

SPI Supplies, "SPI-Chem™ Vinylec® (Formvar®) Resins," Formvar Resin—Applications, from http://www.2spi.com/catalog/submat/formvar-resins.shtml, accessed on Jul. 30, 2010, 4 pp.

Butvar, "Polyvinyl Butyral (PVB) Resin," Homepage and Ceramic Binder Applications Technical Bulletin, from http://www.butvar.com/en/home.aspx, accessed on Jul. 30, 2010, 8 pp.

QuantomiX Technology, "WETSEM™ Technology," Introduction, FAQ, Application Notes, Technical Notes, White paper ("Organ Specific Lipid Imaging and Quantification with WETSEM Technology"), from http://www.quantomix.com, accessed on Jul. 30, 2010, 26 pp.

Irit Ruach-Nir et al., "A Capsule for Dynamic In-Situ Studies of Hydration Processes by Conventional SEM ," Microscopy and Analysis 20(14), Jul. 2006, pp. 19-21.

* cited by examiner

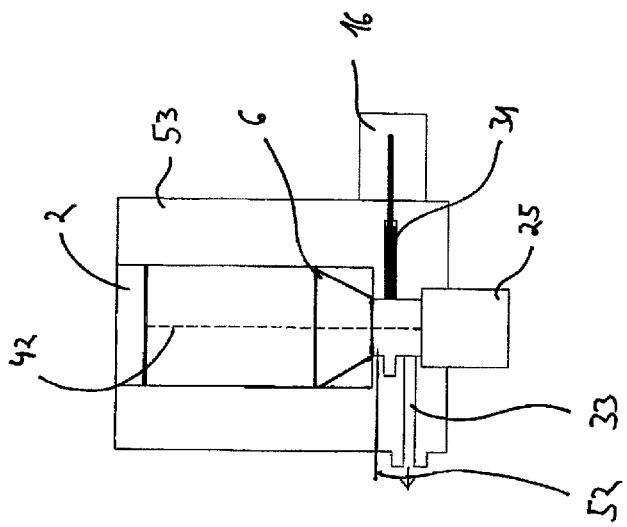
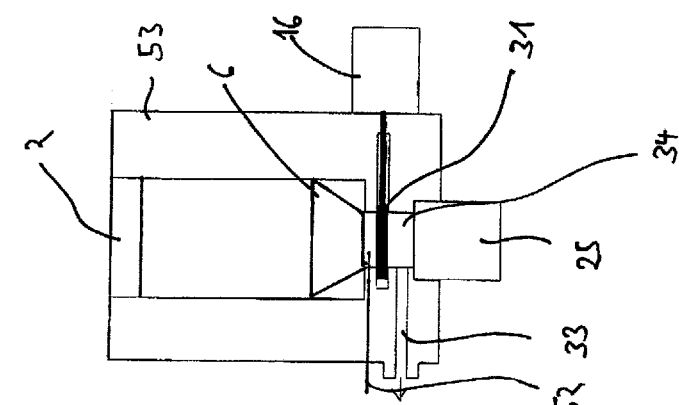
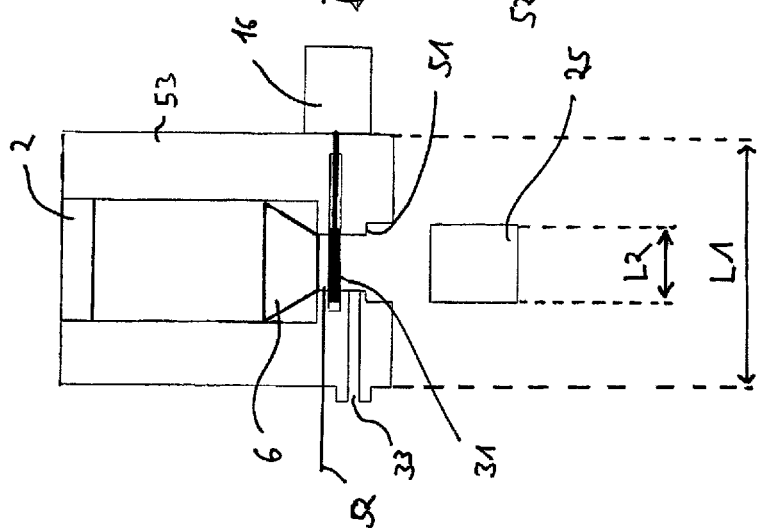

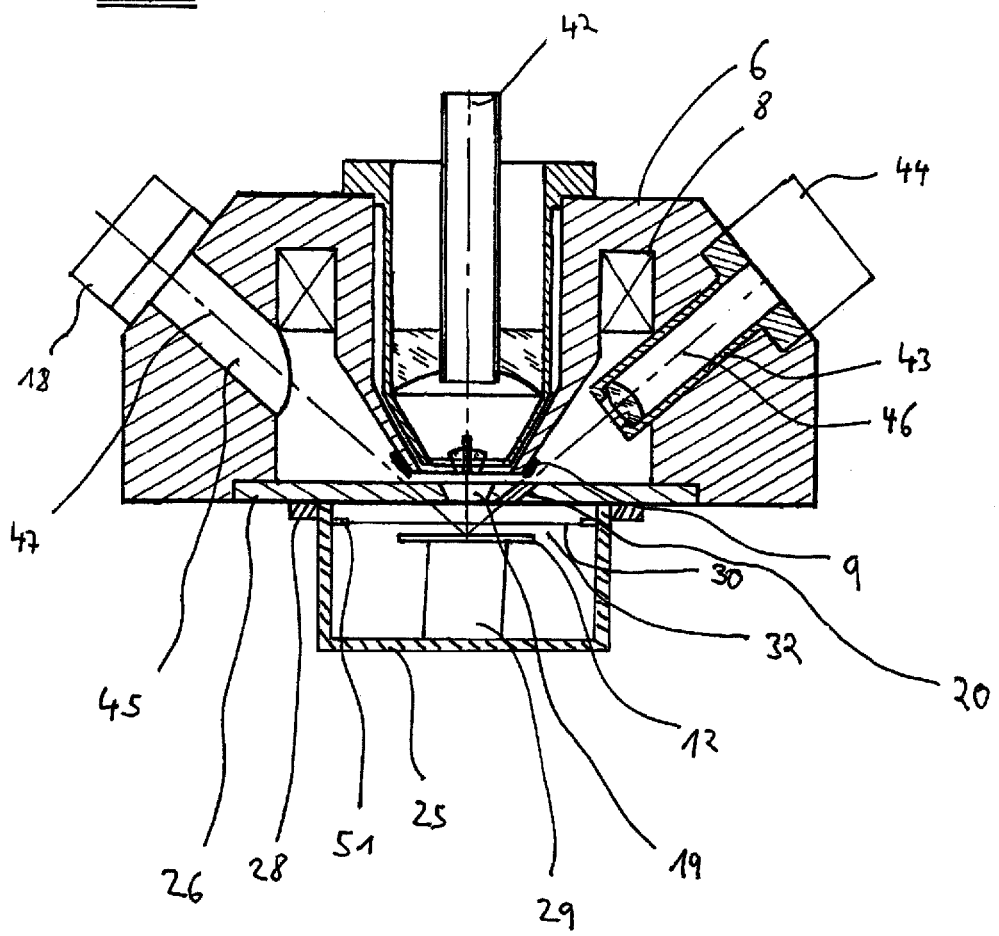
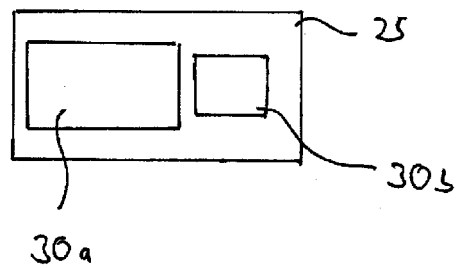

BEAM DEVICE SYSTEM COMPRISING A PARTICLE BEAM DEVICE AND AN OPTICAL MICROSCOPE

TECHNICAL FIELD

This application refers to a beam device, in particular a particle beam device, for analyzing an object, as well as a system comprising a particle beam device and an optical microscope for optically analyzing an object.

BACKGROUND OF THE INVENTION

It is well known in the art to optically analyze an object (hereinafter also referred to as a sample) by means of optical microscopy. However, the resolution of optical microscopy is limited due to the wavelength of the light used. The resolution achieved is in the range of a hundred to a few hundred nanometers.

A particle beam device for analyzing an object such as a scanning electron microscope (SEM) or a transmission electron microscope (TEM) has a better resolution than a device of optical microscopy above mentioned. Therefore, analysis by using a particle beam device is preferred if a high resolution in the range of a few nanometers is required.

U.S. Pat. No. 4,440,475 discloses an electron probe microanalyzer which is combined with an optical microscope. Therefore, an object can be analyzed by means of the electron probe microanalyzer as well as by means of the optical microscope.

One important role of today's science is the examination of biological cells and tissues as well as of diverse objects in today's life sciences. This examination is often carried out by way of optical microscopy and by way of a TEM. A light microscope, for example, is used to examine those objects which may include cells, acellular material and layers of tissue. A TEM is often used for obtaining subcellular information. However, both techniques have their limitations. On the one hand, optical microscopy is limited as to resolution as mentioned above. On the other hand, preparation of the objects for a TEM examination is rather difficult since the objects have to be very thin. Preparation of these objects requires special skills and often takes a few days to achieve.

Using a SEM is often easier since objects to be examined can be of any thickness. However, objects must be placed in a vacuum environment to allow unimpeded motion of the electron beam of the SEM. Therefore, the object to be examined should be dehydrated and dried. Accordingly, it is somewhat difficult to examine biological objects or wet objects with a SEM.

A device for the examination of samples, in particular wet samples in a non-vacuum environment using a SEM, is known in the prior art. The prior art discloses an object chamber (holding element) comprising at least one aperture sealed with a membrane. The membrane is adapted to withstand pressure gradients resulting from the presence of a vacuum and is transparent to electrons. The interior of the object chamber is isolated from the vacuum. The object chamber facilitates the examination of wet objects including living cells by placing the object chamber into the vacuum sample chamber of a SEM. After the object chamber is placed in the vacuum sample chamber, a vacuum is created in the latter. WO 02/45125 A1, WO 03/104848 A2, WO 03/104846 A2, WO 2004/075209 A1 and WO 2006/021961 are prior art with respect to the object chamber described.

However, the above mentioned known device has the disadvantage that the exchange of objects takes a rather long time since various steps have to be taken: First, the object must be placed into the object chamber which has to be positioned in turn into the vacuum sample chamber of the SEM. Moreover, the vacuum sample chamber has to be evacuated which normally takes 3 to 5 minutes since the vacuum sample chamber normally comprises a volume of approximately 300 mm×300 mm×300 mm.

Therefore, it would be desirable to provide a beam device comprising a means to simplify the exchange and to reduce the time of the exchange of an object to be examined.

SUMMARY OF THE INVENTION

According to the system described herein, a beam device, in particular a particle beam device comprises at least one beam column having an optical axis and at least one beam generator that generates a beam (hereinafter also referred to as a primary beam) and that is arranged in the beam column. Moreover, the beam device comprises at least one objective lens that focuses the beam on an object arranged in a holding element (object chamber) and that is arranged in the beam column. The beam column comprises a first extension (length) perpendicular to the optical axis of the beam column. The holding element comprises a second extension (length) perpendicular to the optical axis. The second extension is parallel to the first extension and is shorter than the first extension. The holding element is arranged at a connecting element of the beam column and is removable from the connecting element. Thus, an exchange of the object or a change of the surrounding conditions of the object, in particular the surrounding atmosphere, is possible.

According to the system described herein, a beam device, in particular a particle beam device, comprises at least one beam generator generating a beam (hereinafter also referred to as a primary beam) and at least one objective lens focusing the beam on an object arranged in a holding element. The objective lens comprises at least one connecting element. The holding element (object chamber) is connected to the connecting element such that the holding element is removable from the connecting element for modification of the object (for example an exchange of the object or a change of the surrounding conditions of the object, in particular the surrounding atmosphere).

Accordingly, the system described herein is based on the idea of arranging the connecting element to the objective lens or to the beam column, wherein the connecting element facilitates an easy exchange of the object or a modification of the object by changing its surrounding conditions. The use of a vacuum sample chamber into which the object or the holding element is positioned is not necessary anymore. Instead, the holding element is directly attached to the connecting element of the objective lens or the beam column. Since the holding element is able to have small dimensions (for example 10 mm×10 mm×10 mm) it requires less time to obtain a reasonable vacuum for carrying out the examination of the object.

The beam column of one preferred embodiment of the invention comprises a first outer surface and a second outer surface. The first extension mentioned above is the distance between the first outer surface and the second outer surface. Moreover, the holding element comprises a third outer surface and a fourth outer surface. The second extension is the distance between the third outer surface and the fourth outer surface. The first outer surface and the second outer surface can be two separate surfaces. Alternatively, the first outer surface and the second outer surface can be connected to each other. The same applies to the third outer surface and the fourth outer surface. In one embodiment of the invention, the first extension is from about 150 mm to about 450 mm, preferably from about 200 mm to about 400 mm, and more preferably from about 250 mm to 350 mm. Furthermore, the second extension of one embodiment of the invention is from about 10 mm to about 100 mm, preferably from about 15 mm to about 80 mm, and more preferably from about 20 mm to about 50 mm. Please note that the invention is not restricted to the mentioned extensions. Thus, any extension suitable for the invention can be used.

One preferred embodiment of the invention further comprises a vacuum chamber in which the beam generator is arranged. The vacuum chamber, which is evacuated by means of a pump system, is needed to increase the mean free path of the beam so that the beam is extended from the beam generator to the area of the object and is able to be focused on the object. According to this preferred embodiment of the invention, the holding element is part of the vacuum chamber, in contrast to the above-mentioned prior art which discloses the holding element being arranged in a vacuum sample chamber and not being part of the vacuum sample chamber.

In a further embodiment of the invention, the connecting element comprises a flange being adapted to connect the holding element to the connecting element. Preferably, at least one of the connecting element and the holding element comprises at least one sealing element, for example an o-ring-sealing or a metal sealing. This facilitates the incorporation of the holding element as part of the vacuum chamber, as mentioned above, and hermetically sealing the holding element to the connecting element.

The connecting element of the beam device according to one preferred embodiment of the invention comprises at least one quick release fastener for connecting the holding element to the connecting element. The quick release fastener can be any suitable fastener to connect the holding element to the connecting element, for example a threaded fastener.

Another embodiment of the invention comprises the connecting element being formed integrally as part of the objective lens or the beam column, thereby reducing the required construction space for the beam device.

The connecting element according to a preferred embodiment of the invention comprises at least one valve. Since the connecting element is associated with the objective lens or the beam column, the valve is also associated with the objective lens or the beam column. The volume between the valve and the holding element is preferably low. The valve supports the changing of the holding element. If the valve is closed, the holding element is able to be removed from the connecting element or is able to be connected to the connecting element. After connecting the holding element to the connecting element, the valve is opened so that the beam is able to be focused on the object. The pumps of the beam device renew the vacuum in the vacuum chamber of the beam device after the opening of the valve. Alternatively or additionally, the connecting element comprises at least one outlet connected to at least one pump. This pump is used to evacuate the volume between the valve and the holding element after connecting the holding element to the connecting element and before opening the valve.

The holding element of a preferred embodiment of the invention is formed like a chamber having at least one aperture. The object to be examined is arranged in the interior of the chamber. Preferably, the aperture is sealed with at least one membrane being adapted to withstand pressure gradients resulting from a vacuum. The membrane may be a foil or a film. The interior of the holding element is isolated from the vacuum by the membrane. The membrane is preferably removable from the holding element.

Preferably, the membrane is transparent for particles, in particular electrons and ions. Alternatively or additionally, the membrane is transparent for light (for example visible light and/or laser light). Moreover, the membrane preferably comprises a thickness within the range of 50 Å to 6000 Å, preferably within the range of 100 Å to 5000 Å. A thickness within the ranges mentioned facilitates on the one hand transparency for particles and on the other hand the ability to withstand the pressure gradients resulting from the vacuum and normal atmosphere (or any other atmosphere in the holding element). The membrane is preferably formed of material selected from the group consisting of polymide, polyamide, polyamide-imide, polyethylene, polypyrrole, and conditional conducting polymers, Parlodion™, collodion, Kapton™, FormVar™, Vinylec™, ButVar™, Pioloform™, silicon dioxide, silicon monoxide and carbon.

The aperture of the holding element of a preferred beam device has a diameter within the range of 0.1 mm to 4 mm, preferably within the range of 0.3 mm to 3 mm. This size of the diameter enables the above-mentioned membrane to maintain the characteristics mentioned above with respect to the withstanding of the pressure gradient, even as the membrane seals the aperture.

The holding element is preferably adapted to hold the interior of the holding element at atmospheric pressure or substantially atmospheric pressure. This pressure is often needed when examining in-vivo processes of many biological objects.

One preferred embodiment of the beam device according to the invention comprises a special mounting of the object in the holding element. The object is positioned in the holding element in proximity to the membrane. Moreover, the object is preferably positioned in the holding element in contact with the membrane. Both embodiments result in the mean free path in particular of a particle beam being able to be focused on the object.

One further embodiment comprises at least one means for influencing the object while it is in the holding element and while it is examined in the beam device. In particular, the embodiment comprises a means for filling the holding element with a gas and/or a liquid. This facilitates examinations of objects under certain conditions, for example with respect to pressure, temperature and atmosphere.

A further preferred embodiment of the beam device according to the invention comprises an optical microscope for optical analysis of the object. Therefore, this embodiment is, for example, a combination of a particle beam device and an optical microscope. It is possible to examine the object either by the beam generated by the beam generator or by the optical microscope. Alternatively, the object can be simultaneously examined by the beam generated by the beam generator and the optical microscope. The optical microscope can be any suitable optical microscope (for example a light microscope or a laser scanning microscope). The optical microscope preferably comprises at least one microscope objective and at least one microscope condenser, at least one of them preferably adapted to be moved in one of the following positions: an analyzing position and a resting position. This facilitates, for example, moving the microscope objective over the object (analyzing position) and moving it from this position back to a resting position in which the beam generated by the beam device will be focused on the object for examination of the object with the beam. Moreover, the microscope objective is adapted to be moved such that any given area of particular interest can be examined.

If the microscope objective and/or the microscope condenser are mounted within the vacuum chamber of the beam device, the microscope objective and/or the microscope condenser preferably comprises at least one means for pressure compensation so that lenses arranged in the microscope objective and/or microscope condenser are not damaged.

In a preferred embodiment of the beam device according to the invention with respect to the connecting element arranged at the objective lens, at least one of the microscope objective and the microscope condenser comprises a first axis, whereas the beam device comprises a beam column having a second axis. The angle between the first axis and the second axis is different from V.

In a further preferred embodiment of the beam device according to the invention with respect to the connecting element arranged at the beam column, at least one of the microscope objective and the microscope condenser comprises a first axis. The angle between the first axis and the optical axis of the beam column is different from 0°.

The beam device may be an electron beam device, in particular a scanning electron microscope. Alternatively, the beam device may be an ion beam device.

A system according to that described herein may be given by the following features. The system comprises a particle beam device having a beam generator that generates a beam, an objective lens that focuses the beam on an object, and at least one detector which is used for detecting, for example, electrons. These electrons may be electrons scattered on the object (backscattered electrons) or emitted by the object (secondary electrons). Alternatively or additionally, the electrons may be suitable for a TEM examination. Moreover, the system comprises an optical microscope for optical analysis of the object. Additionally, the system comprises a holding element and at least one membrane adapted to withstand pressure gradients resulting from a vacuum and to isolate the object from the vacuum.

This system has the same advantages as the embodiments mentioned before.

The membrane of one preferred embodiment of the system is transparent for particles, in particular electrons or ions. Alternatively or additionally, the membrane is transparent for light.

A further preferred embodiment of the system comprises at least two membranes arranged at the holding element, namely a first membrane and a second membrane. The first membrane is preferably arranged at a first position on the holding element, whereas the second membrane is preferably arranged at a second position on the holding element. In a preferred embodiment, the first membrane is transparent for particles, whereas the second membrane is transparent for light. The embodiments now described are preferably used for a system in which particles are guided from a first direction to the object and light for the optical analysis is guided from a second direction to the object, the first and second direction not being identical. This is advantageous when using the first direction as the direction of incident light and the second direction as the direction of incident and impinging particles (and vice versa).

The holding element of a preferred embodiment of the system is formed like a chamber having at least one aperture. The object to be examined is arranged in the interior of the chamber. Preferably, the aperture is sealed with the membrane or at least one of the first membrane and the second membrane, with the membrane and/or the first and second membranes being adapted to withstand pressure gradients resulting from a vacuum. The membrane and/or at least one of the first membrane and the second membrane may be a foil or a film. Moreover, the membrane and/or at least one of the first membrane and the second membrane preferably comprises a thickness within the range of 50 Å to 6000 Å, preferably within the range of 100 Å to 5000 Å. A thickness within the ranges mentioned facilitates on the one hand the transparency for particles and on the other hand the ability to withstand the pressure gradient resulting from the vacuum and the normal atmosphere (or any other atmosphere in the holding element). The membrane and/or at least one of the first membrane and the second membrane is preferably formed of material selected from the group consisting of polymide, polyamide, polyamide-imide, polyethylene, polypyrrole, and conditional conducting polymers, Parlodion™, collodion, Kapton™, FormVar™, Vinylec™, ButVar™, Pioloform™, silicon dioxide, silicon monoxide and carbon.

The aperture of the holding element preferably has a diameter within the range of 0.1 mm to 4 mm, preferably within the range of 0.3 mm to 3 mm. This diameter if sealed with the above-mentioned membrane or at least one of the first membrane and the second membrane facilitates the composition of the membrane to comprise the characteristics mentioned above with respect to the withstanding of the pressure gradient.

The holding element is preferably adapted to hold the interior of the holding element at atmospheric pressure or substantially atmospheric pressure. This pressure is needed when examining in-vivo processes of many biological objects, as also mentioned above.

One preferred embodiment of the system according to the invention comprises a special mounting of the object in the holding element. The object is positioned in the holding element in proximity to the membrane or at least one of the first membrane and the second membrane. Moreover, the object is preferably positioned in the holding element in contact with the membrane or at least one of the first membrane and the second membrane. Both embodiments facilitate the sufficiency of the mean free path in particular of a particle beam to be focused on the object.

One further embodiment of the system comprises at least one means for influencing the object while in the holding element and while being examined in the system. In particular, the embodiment preferably comprises a means for filling the holding element with a gas and/or a liquid. This facilitates examinations of objects under certain conditions, for example with respect to pressure, temperature and atmosphere.

The optical microscope preferably comprises at least one microscope objective and at least one microscope condenser, at least one of them preferably adapted to be moved, in particular into one of the following positions: an analyzing position and a resting position. For example, the microscope objective is able to be moved over the object (analyzing position) and to be moved from this position back to a resting position in which the beam generated by the beam device will be focused on the object for examination of the object with the beam.

If the microscope objective and/or the microscope condenser are mounted within a vacuum chamber of the beam device, the microscope objective and/or the microscope condenser preferably comprise(s) a means for pressure compensation such that lenses arranged in the microscope objective and/or microscope condenser are not damaged.

In a preferred embodiment of the system according to the invention, at least one of the microscope objective and the microscope condenser comprises a first axis, whereas the particle beam device comprises a beam column having a second axis. The angle between the first axis and the second axis is different from 0°.

The beam device of the system may be an electron beam device, in particular a scanning electron microscope. Alternatively, the beam device of the system may be an ion beam device.

BRIEF DESCRIPTION OF THE DRAWINGS

The invention Embodiments of the system described herein will now be explained in more detail below based on the accompanying figures, which are briefly described as follows.

FIG. 4d-f show schematic partial views of a further particle beam device in the form of a scanning electron microscope;

FIG. 6 shows a schematic partial view of a combination of a particle beam device and an optical microscope;

FIG. 7 shows a schematic view of a holding element;

DETAILED DESCRIPTION OF VARIOUS EMBODIMENTS

Embodiments of the system described herein will now be described with respect to a scanning electron microscope (SEM). However, as mentioned above, the system described herein is not restricted to a scanning electron microscope. In fact, the system described herein can be provided for use with any particle beam device such as a transmission electron microscope (TEM) or an ion beam microscope.

Figure 1:
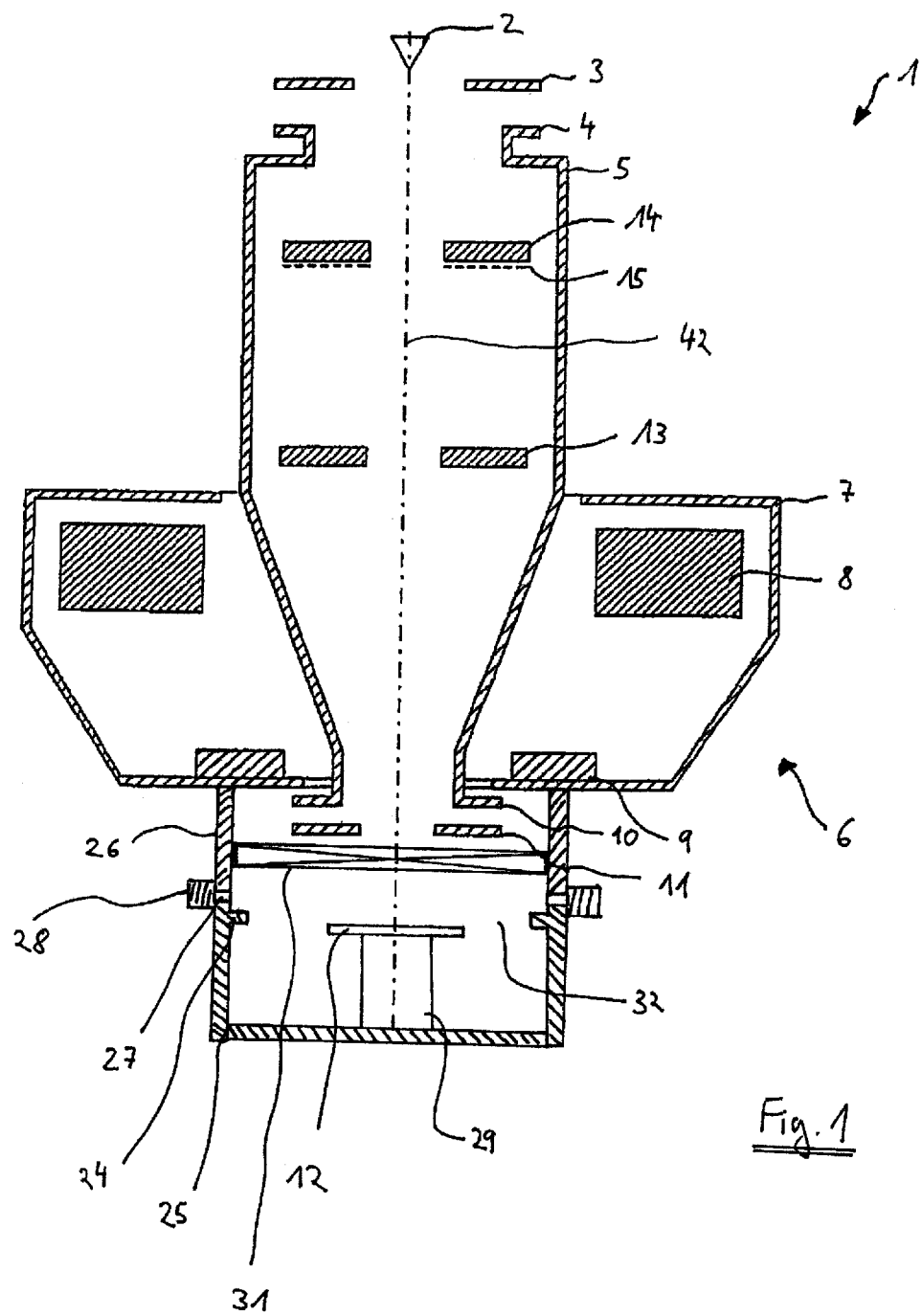
FIG. 1 shows a schematic representation of a particle beam device in the form of a scanning electron microscope.

FIG. 1 shows a schematic representation of a particle beam device in the form of a embodiment of a scanning electron microscope 1. The scanning electron microscope 1 comprises a beam generator in the form of an electron source 2 (cathode), an extraction electrode 3 as well as an anode 4 which at the same time forms one end of a beam guidance tube 5 of the scanning electron microscope 1. The electron source 2 is preferably a thermal field emitter. Electrons that emerge from the electron source 2 are accelerated to anode potential on account of a potential difference between the electron source 2 and the anode 4. In the beam guidance tube 5, the energy of the electrons is maintained and slowed down to a desired energy only shortly before striking an object 12 to be examined (specimen), which is explained in greater detail below.

The beam guidance tube 5 is directed through a bore hole which is arranged in a pole piece 7 of an objective lens 6 (magnetic lens) acting as a lens system. Coils 8 are arranged in the pole piece 7. Connected downstream from the beam guidance tube 5 is an electrostatic retarder. This is made up of a single electrode 11 and a tubular electrode 10 which is formed on the end of the beam guidance tube 5 opposite the object 12. The tubular electrode 10 together with the beam guidance tube 5 is thus at anode potential while the single electrode 11 as well as the object 12 are at a potential that is lower in relation to the anode potential. This facilitates the electrons of a primary electron beam (beam generated by the electron source 2) to be slowed down to a desired, low energy necessary for examining the object 12. Furthermore, scanning means 9 are provided through which the primary electron beam may be deflected and scanned over the object 12.

When the primary electron beam impinges the object 12, electrons are scattered on the object (backscattered electrons) or are emitted from the object (secondary electrons). The backscattered electrons and the secondary electrons are used for imaging and form the so called secondary electron beam. To detect secondary electrons or backscattered electrons that develop on account of the interaction of the primary electron beam with the object 12, a detector system having a detector 13 and a detector 14 is arranged in the beam guidance tube 5. Detector 13 is positioned object-side along optical axis 42 in the beam guidance tube 5, while detector 14 is positioned source-side along optical axis 42. Furthermore, the two detectors 13, 14 are staggered with respect to one another toward the optical axis 42 of the scanning electron microscope 1 and each exhibits a substantially ring-shaped detection surface.

The detector 13 detects those electrons that emerge from the object 12 under a relatively large solid angle. These are mainly secondary electrons. On the other hand, only a very small portion of backscattered electrons which exhibit a relatively high kinetic energy in comparison to the secondary electrons when emerging from the object 12, are detected by the detector 13 since the backscattered electrons that pass the direction of acceleration are focused by the lens relatively close to the optical axis 42 and are consequently able to pass through a hole in detector 13.

After passing through the detector 13, the secondary electron beam consequently includes secondary electrons as well as backscattered electrons, the majority of the secondary electrons emitted from the object 12 no longer existing in the secondary electron beam.

Detector 14 comprises an opposing field grid 15. The secondary and backscattered electrons that develop due to the interaction with the object 12 are again directed in the beam guidance tube 5 of the scanning electron microscope 1. A voltage applied to the opposing field grid 15 is chosen so that secondary electrons may be deflected by the opposing field grid 15 so that they do not strike the detector 14. In this case, only backscattered electrons penetrate the opposing field grid 15 and strike the detector 14. The corresponding signals generated by the detector 14 are then used for imaging. The opposing field grid 15 exhibits a voltage of minus 100 volts, for example. The backscattered electrons may pass through the opposing field grid 15 because of their energies. The secondary electrons that normally exhibit an energy <50 eV are not able to reach the detector 14 because of the voltages applied.

The objective lens 6 comprises a connecting element 26 in the form of a flange integrally formed to the objective lens 6. Alternatively, the connecting element 26 might be a separate member being connected only to the objective lens 6. The connecting element 26 and the beam guidance tube 5 form a vacuum chamber which is evacuated in order to create a vacuum. This provides the necessary mean free path for the electrons of the primary electron beam such that the primary electron beam is able to impinge the object 12.

A holding element 25 in the form of a capsule is connected to the connecting element 26 by means of a quick release fastener 28. The quick release fastener 28 can be any suitable fastener to connect the holding element 25 to the connecting element 26, for example a threaded fastener. A sealing 27 (for example an o-ring sealing or a metal sealing) is provided in the connecting area between the holding element 25 and the connecting element 26. This provides a sufficient sealing such that the beam guidance tube 5, the connecting element 26 and the holding element 25 form the above mentioned vacuum to chamber. Therefore, the holding element 25 is part of the vacuum chamber of the scanning electron microscope 1.

Due to the quick release fastener 28, the holding element 25 is connected to the connecting element 26 such that the holding element 25 is removable from said connecting element 26 for modification or exchange of the object 12, as explained in detail below.

The object 12 is supported by a supporting element 29 being part of the holding element 25. The supporting element 29 is preferably adjustable and movable such that the position of the object 12 can be changed, in particular along the optical axis 42.

Furthermore, the connecting element 25 comprises a valve 31 separating the connecting element 26 and the holding element 25. Since the connecting element 26 is associated with the objective lens 6, the valve 31 is also associated with the objective lens 6. The volume between the valve 31 and the holding element 25 is preferably low. If the valve 31 is closed, the holding element 25 is able to be removed from the connecting element 26 by opening the quick release fastener 28. The holding element 25 is also able to be connected with the connecting element 26 by closing the quick release fastener 28. After connecting the holding element 25 to the connecting element 26, the valve 31 is opened so that the primary electron beam is able to be focused on the object 12. A pump system (not shown) of the scanning electron microscope 1 renews the vacuum in the vacuum chamber after the opening of the valve 31.

Figure 2:
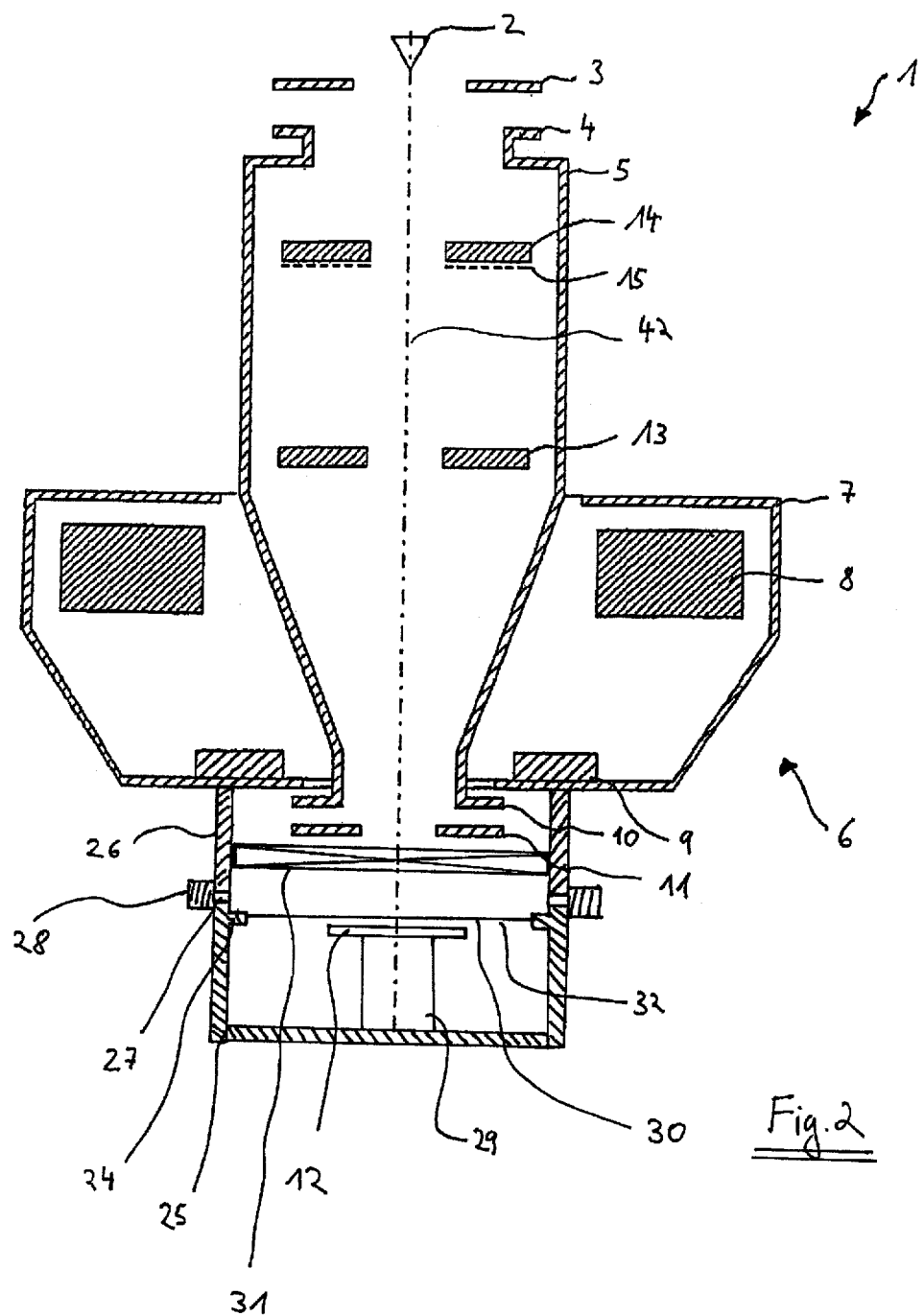
FIG. 2 shows a further schematic representation of a particle beam device in the form of a scanning electron microscope.

FIG. 2 shows another embodiment of a scanning electron microscope 1, being almost identical to the scanning electron microscope 1 of FIG. 1. This embodiment further comprises a membrane 30 being mounted at the holding element 25 and sealing an aperture 32 of the holding element. The membrane 30 is mounted to the holding element by means of a quick release fastener 24. The aperture 32 preferably has a diameter within the range of 0.1 mm to 4 mm and more preferably within the range of 0.3 mm to 3 mm. The membrane 30 comprises a thickness within the range of 50 Å to 6000 Å, preferably within the range of 100 Å to 5000 Å. The membrane 30 seals the interior of the holding element 25, in which the object 12 is positioned and is adapted to withstand pressure gradients resulting from the vacuum in the vacuum chamber of the scanning electron microscope 1. A thickness within the ranges mentioned above facilitates on the one hand the transparency for electrons and on the other hand the ability to withstand the pressure gradients resulting from the vacuum and normal atmosphere (or any other atmosphere in the holding element 25). The membrane 30 is preferably formed of material selected from the group consisting of polymide, polyamide, polyamide-imide, polyethylene, polypyrrole, and conditional conducting polymers, Parlodion™, collodion, Kapton™, FormVar™, Vinylec™, ButVar™, Pioloform™, silicon dioxide, silicon monoxide and carbon.

The object 12 is positioned in the holding element 25 by adjusting the supporting element 29 such that the object 12 is positioned in proximity to the membrane 30. This facilitates the sufficiency of the mean free path of the electrons of the primary electron beam such that the primary electron beam can be focused on the object 12 and impinge the object 12.

Figure 3:
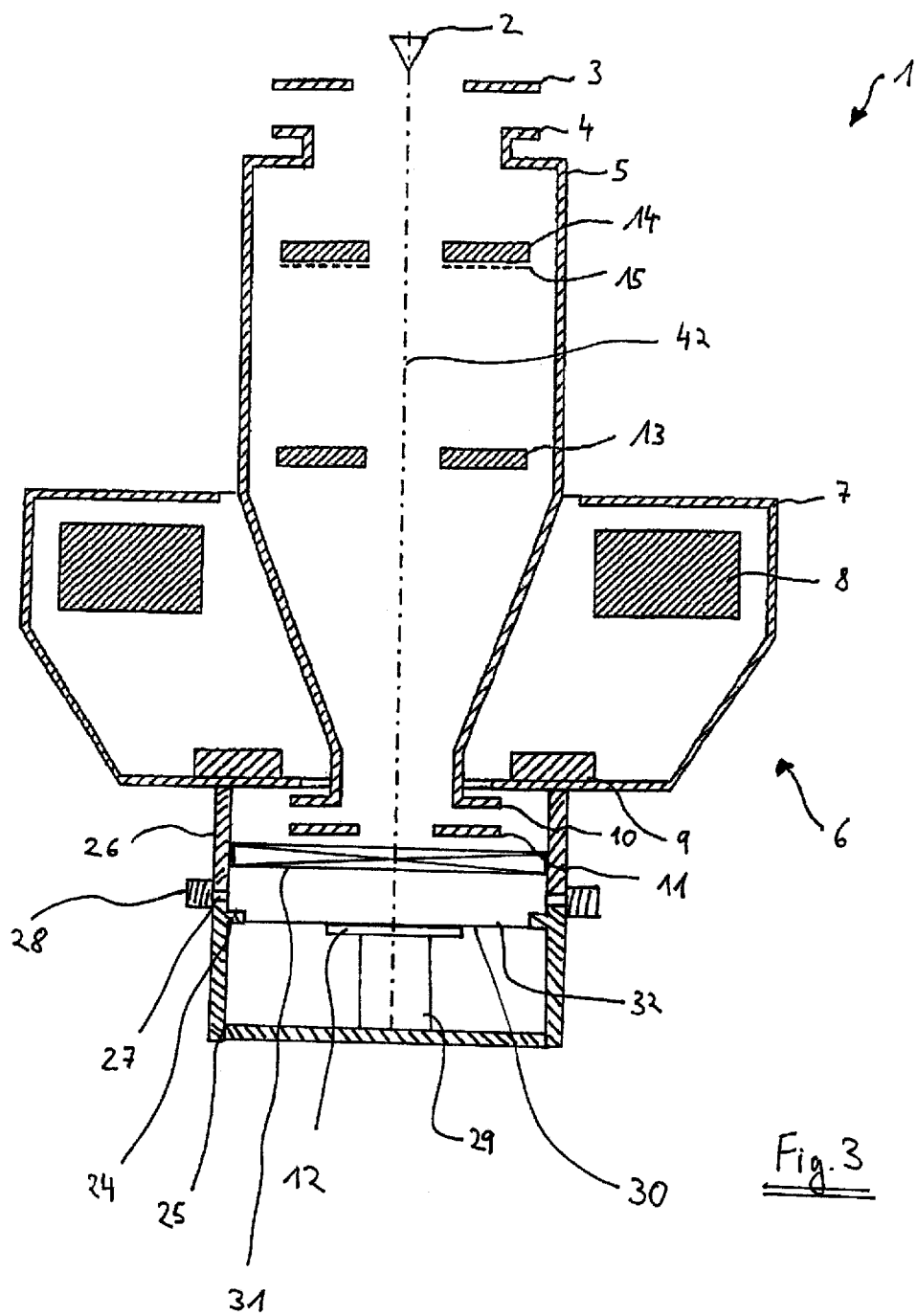
FIG. 3 shows another schematic representation of a particle beam device in the form of a scanning electron microscope.

FIG. 3 shows another embodiment of a scanning electron microscope 1 being almost identical to the scanning electron microscope 1 of FIG. 2. In this embodiment, the object 12 is positioned in contact with the membrane 30 by adjusting the supporting element 29. This also facilitates the sufficieny of the mean free path of the electrons of the primary electron beam such that the primary electron beam impinges the object 12.

Figure 4A:
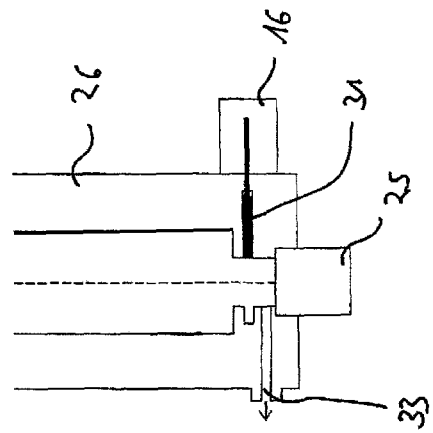
FIG. 4a-c show schematic partial views of a particle beam device in the form of a scanning electron microscope.
Figure 4B:
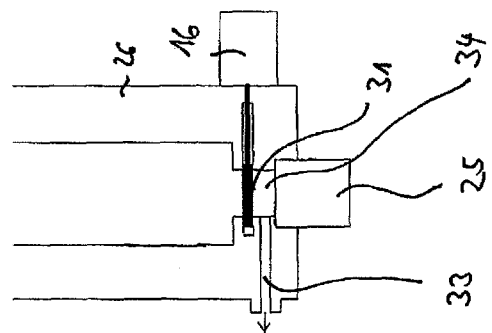
Figure 4C:
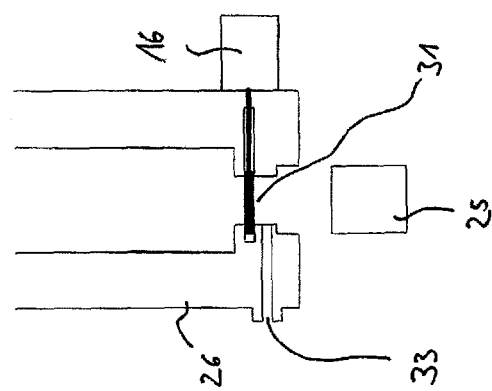

FIGS. 4a to 4c show schematic partial views of an embodiment of the scanning electron microscope 1, being identical to the embodiments mentioned above. FIGS. 4a to 4c illustrate the connection between the connecting element 26 and the holding element 25. According to this embodiment, the connecting element 26 comprises a valve 31 moved by a magnetic device 16 into a closed position (FIGS. 4a and 4b) and into an open position (FIG. 4c). The connecting element 26 comprises an outlet 33 connected to the pump system (not shown) of the scanning electron microscope 1. FIG. 4a shows the holding element 25 and the connecting element 26 separated from each other. The valve 31 is in the closed position. The holding element 25 can be connected to the connecting element 26 by threaded elements provided to the holding element 25 and the connecting element 26. FIG. 4b shows the holding element 25 connected to the connecting element 26 by means of the threaded elements. A sealing in the form of a metal sealing is provided in the connecting area between the holding element 25 and the connecting element 26, as already mentioned above. After connecting the holding element 25 and the connecting element 26 the pump system evacuates the volume 34 between the valve 31 and the holding element 25. This volume 34 is rather low in comparison to a vacuum sample chamber of the prior art and, therefore, the evacuation takes less time than evacuating a vacuum sample chamber of the prior art. After the volume 34 is evacuated, the valve 31 is moved by the magnetic device 16 into the open position of FIG. 4c such that the primary electron beam of the scanning electron microscope 1 is able to impinge the object 12 positioned in the holding element 25.

FIGS. 4d to 4f show another embodiment of a scanning electron microscope. The scanning electron microscope comprises a beam column 53 (electron column) comprising a beam generator 2 for generating an electron beam. Furthermore, the beam column 53 comprises an objective lens 6 and a connecting element 51 in the form of a flange into which a holding element 25 can be mounted. The connecting element 51 is integrally formed in the beam column 53. Alternatively, the connecting element 51 can be a separate element to the beam column 53. The beam column 53 can be any beam column. A preferred embodiment is described in U.S. Pat. No. 6,365,898 B1 which is incorporated hereinto by reference.

The holding element 25 of the embodiment according to FIGS. 4d to 4f can be any holding element as already described herein. In one embodiment the holding element 25 comprises a membrane sealing an aperture of the holding element 25. Alternatively, the holding element 25 does not comprise any membrane. The beam column 53 comprises a diameter L1 which is measured from the outer surface of the beam column 53, perpendicular to the optical axis 42. The diameter L1 is from about 150 mm to about 450 mm, preferably from about 200 mm to about 400 mm, and more preferably from about 250 to about 350 mm. The holding element 25 comprises also a diameter, namely diameter L2 which is measured from the outer surface. The diameter L2 is from about 10 mm (sometimes even smaller) to about 100 mm, preferably from about 15 mm to about 80 mm, and more preferably from about 20 mm to about 50 mm. Therefore, the holding element 25 is smaller than the beam column 53. Since the holding element 25 is directly attached to the connecting element 51 of the beam column 53, it requires less time to obtain a reasonable vacuum for carrying out the examination of the object 12.

The connecting element 51 comprises a valve 31 moved by a magnetic device 16 into a closed position (FIGS. 4d and 4e) and into an open position (FIG. 4f). The connecting element 51 comprises an outlet 33 connected to the pump system (not shown) of the scanning electron microscope 1. FIG. 4d shows the holding element 25 and the connecting element 51 separated from each other. The valve 31 is in the closed position. The holding element 25 can be connected to the connecting element 51 by threaded elements provided to the holding element 25 and the connecting element 51. FIG. 4e shows the holding element 25 connected to the connecting element 51 by means of the threaded elements. A sealing in the form of a metal sealing is provided in the connecting area between the holding element 25 and the connecting element 51, as already mentioned above. After connecting the holding element 25 and the connecting element 51 the pump system evacuates the volume 34 between the valve 31 and the holding element 25. This volume 34 is rather low in comparison to a vacuum sample chamber of the prior art and, therefore, the evacuation takes less time than evacuating a vacuum sample chamber of the prior art. After the volume 34 is evacuated, the valve 31 is moved by the magnetic device 16 into the open position of FIG. 4f such that the primary electron beam of the scanning electron microscope 1 is able to impinge the object 12 positioned in the holding element 25. Electrons scattered from the object 12 or emitted by the object 12 can be detected by a detector 52. This detector 52 can also be arranged somewhere else in the beam column 53.

Figure 5:
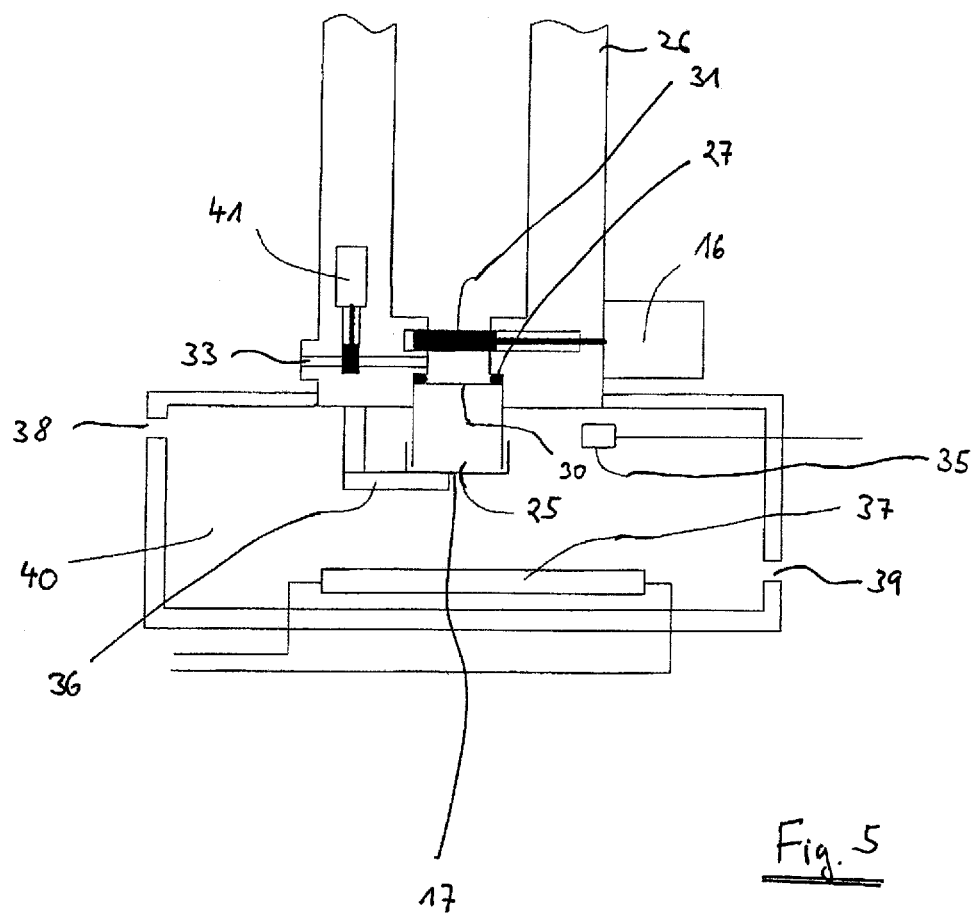
FIG. 5 shows a schematic partial view of a further particle beam device in the form of a scanning electron microscope.

FIG. 5 shows a schematic partial view of another embodiment of the scanning electron microscope 1, being identical to the embodiments of FIGS. 1 to 3 and being also similar to the embodiment of FIGS. 4a to 4c. FIG. 5 illustrates a further embodiment of the connection between the connecting element 26 and the holding element 25, having a means for modification of the object 12 positioned in the holding element 25. The connecting element 26 of this embodiment also comprises a valve 31 moved by a magnetic device 16 into a closed position (FIG. 5) and into an open position (not shown). The connecting element 26 also comprises an outlet 33 connected to the pump system (not shown) of the scanning electron microscope 1. The outlet 33 is opened and closed by a valve 41 controlled by a magnetic device.

The holding element 25 and the connecting element 26 are connected to each other. The sealing 27 provides a proper hermetically sealed connection between the holding element 25 and the connecting element 26. The holding element 25 is connected to the connecting element 26 by a quick release fastener 36 mounted at the connecting element 26 and is also able to position the object held inside the holding element 25. For example, the quick release fastener 36 positions the object in the proximity of or on the membrane 30, sealing the interior of the holding element 25 to the vacuum. Moreover, the holding element 25 comprises a bottom part 17 having openings so that a liquid or a gas might enter the interior of the holding element 25, thereby changing the surrounding conditions of the object. This is advantageous with respect to examinations of in-vivo processes of many biological objects under specific conditions.

The means of modification of the object comprise a modification chamber 40 mounted at the connecting element 26. The modification chamber 40 has an inlet 38 and an outlet 39. The liquid or gas mentioned above might be introduced through the inlet 38 into the modification chamber 40, then be inserted into the holding element 25 through the bottom part 17 of the holding element 25 and be guided out of the modification chamber 40 through the outlet 39. The modification chamber 40 further comprises a heating-cooling-element 37 also influencing the surrounding conditions of the object positioned in the holding element 25.

The surrounding conditions of the object in the modification chamber 40 and, therefore, also in the holding element 25 are monitored by at least one sensor 35. FIG. 5 shows one sensor 35 being positioned in the modification chamber 40 and monitoring in particular the temperature, gas concentration and pressure in the area of the object.

The connecting element 26 as shown in FIG. 5 can alternatively be a beam column 53, as described above.

As mentioned above, all embodiments are based on the idea of arranging the connecting element 26 to the objective lens 6 (or arranging the connecting element 51 to the beam column 53), wherein the connecting element 26 and connecting element 51 facilitate an easy exchange of the object 12. The use of a vacuum sample chamber being evacuated and into which the object or the holding element 25 is positioned is no longer necessary. Instead, the holding element 25 is directly attached to the connecting element 26 of the objective lens 6 or the connecting element 51 of the beam column 53. Since the holding element 25 is able to have small dimensions, the time required to obtain a reasonable vacuum is low which makes an exchange of the object comparably convenient.

FIG. 6 shows an embodiment of a device comprising the scanning electron microscope 1 described above with respect to FIGS. 1 to 3 and an additional optical microscope for optically analyzing an object 12. FIG. 6 is only a partial view of the device showing the area of the objective lens 6 of the scanning electron microscope 1 having also all other features mentioned above (but not shown in FIG. 6).

The optical microscope comprises a microscope objective 43 associated with a monitoring device 44 such as a camera or an ocular. The microscope objective 43 comprises an optical axis 46 being inclined with respect to the optical axis 42 of the electron column of the scanning electron microscope 1. The angle between the optical axis 46 and the optical axis 42 is substantially 45° in this embodiment. The optical microscope further comprises a microscope condenser 45 being arranged opposite to the microscope objective 43 and having an optical axis 47 being inclined with respect to the optical axis 42 by an angle of substantially 45°. The microscope condenser 45 is associated with a light source 18. The function of the optical microscope is well known in the art and, therefore, will not be described in further detail.

The objective lens 6 also comprises the connecting element 26 which is formed as a circular plate in this embodiment. The connecting element 26 comprises the quick release fastener 28 which connects the holding element 25 to the connecting element 26. Furthermore, the hermetical sealing 27 is provided between the holding element 25 and the connecting element 26. The holding element 25 is assembled identically to the embodiment of FIG. 2.

The connecting element 26 comprises two openings. Opening 19 is arranged at the optical axis 42 and is an aperture for the primary electron beam as well as the secondary electron beam as mentioned above. Opening 20 is an aperture for the light reflected by the object 12 and directed into the microscope objective 43. The membrane 30 of this embodiment is transparent for electrons as well as for light.

The embodiment according to FIG. 6 comprises the advantages mentioned for the other described embodiments. Moreover, it is possible to examine the object 12 either by the primary electron beam or by the optical microscope. Alternatively, the object 12 can be simultaneously examined by the primary electron beam and the optical microscope.

FIG. 7 shows a holding element of an embodiment almost identical to the embodiment of FIG. 6. However, the holding element 25 comprises two membranes, namely a first membrane 30a and a second membrane 30b. Both membranes 30a and 30b seal corresponding apertures of the holding element 25 and are adapted to withstand pressure gradients with respect to the vacuum needed in the vacuum chamber of the scanning electron microscope 1. The first and second membranes 30a and 30b isolate the object 12 positioned in the holding element 25 from the vacuum.

Figure 8:
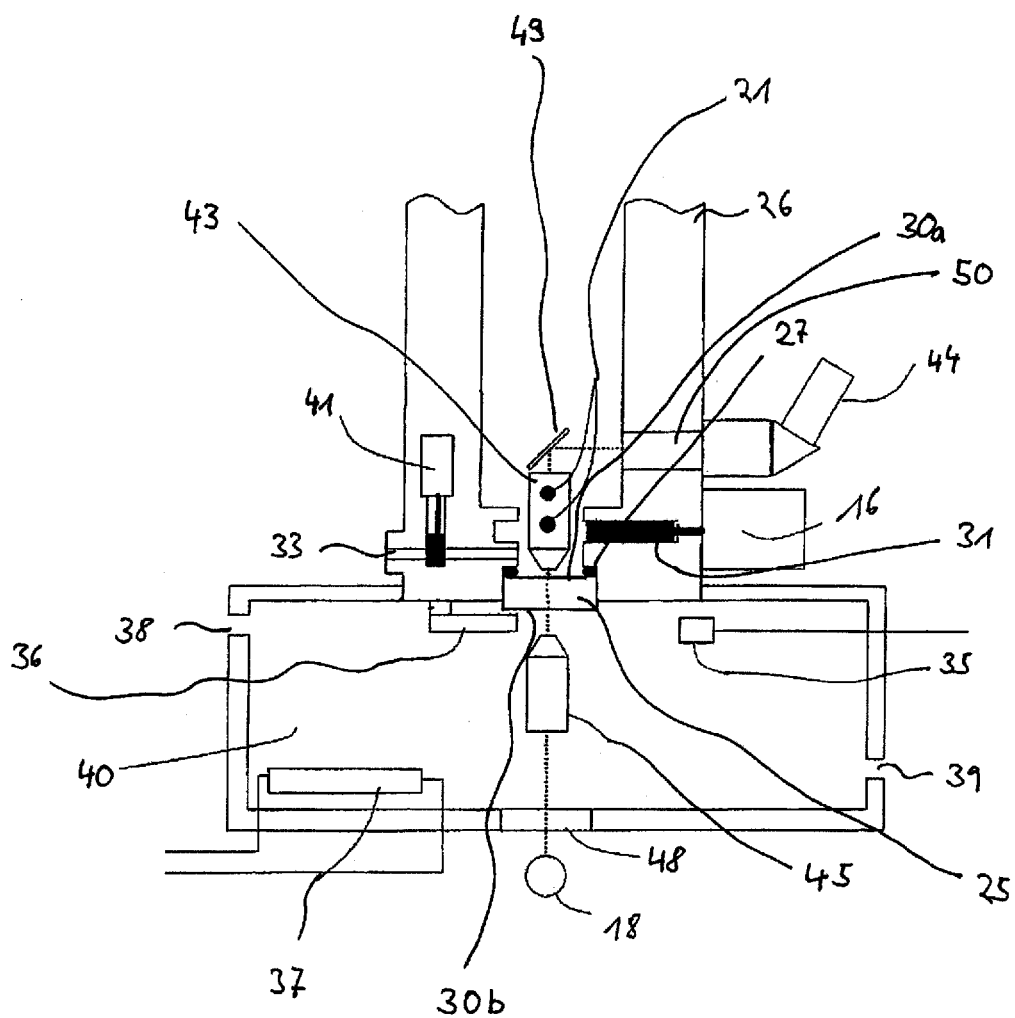
FIG. 8 shows a schematic view of an embodiment of a combination of a particle beam device and an optical microscope.

FIG. 8 shows another embodiment of the combination of the scanning electron microscope 1 and the optical microscope. This embodiment is similar to the embodiment of FIG. 5. Identical components are marked with the identical reference signs. In addition to the features shown in FIG. 5, the scanning electron microscope 1 comprises a microscope objective 43, a light source 18, a microscope condenser 45 and a monitoring device 44. The monitoring device 44 is arranged at the connecting element 26 and is associated with an opening 50. Moreover, the optical microscope comprises a mirror 49 which is associated with the opening 50 and the monitoring device 44. The light source 18 of the optical microscope is arranged outside of the modification chamber 40 and is associated with an opening 48 in the modification chamber 40 so that light can be directed from the light source 18 to the holding element 25.

The holding element 25 of this embodiment comprises two membranes, namely a first membrane 30a, which is transparent for electrons and light transmitted through the object to the microscope objective 43, and a second membrane 30b, which is transparent for the light of the light source 18.

The mirror 49, the microscope objective 43 and the microscope condenser 45 are adapted to be moved either in an analyzing position shown in FIG. 8 or a resting position. In the analyzing position, the object can be analyzed by means of the optical microscope. In the resting position, the object can be analyzed by means of the primary electron beam of the scanning electron microscope 1. For moving the optical microscope into the resting position, the mirror 49, the microscope objective 43 and the microscope condenser 45 are tilted such that the primary electron beam is able to be focused on the object for examination.

The microscope objective 43 further comprises a means 21 for pressure compensation such that lenses arranged in the microscope objective 43 are not damaged.

The connecting element 26 as shown in FIG. 8 can alternatively be a beam column 53, as described above.

Figure 9:
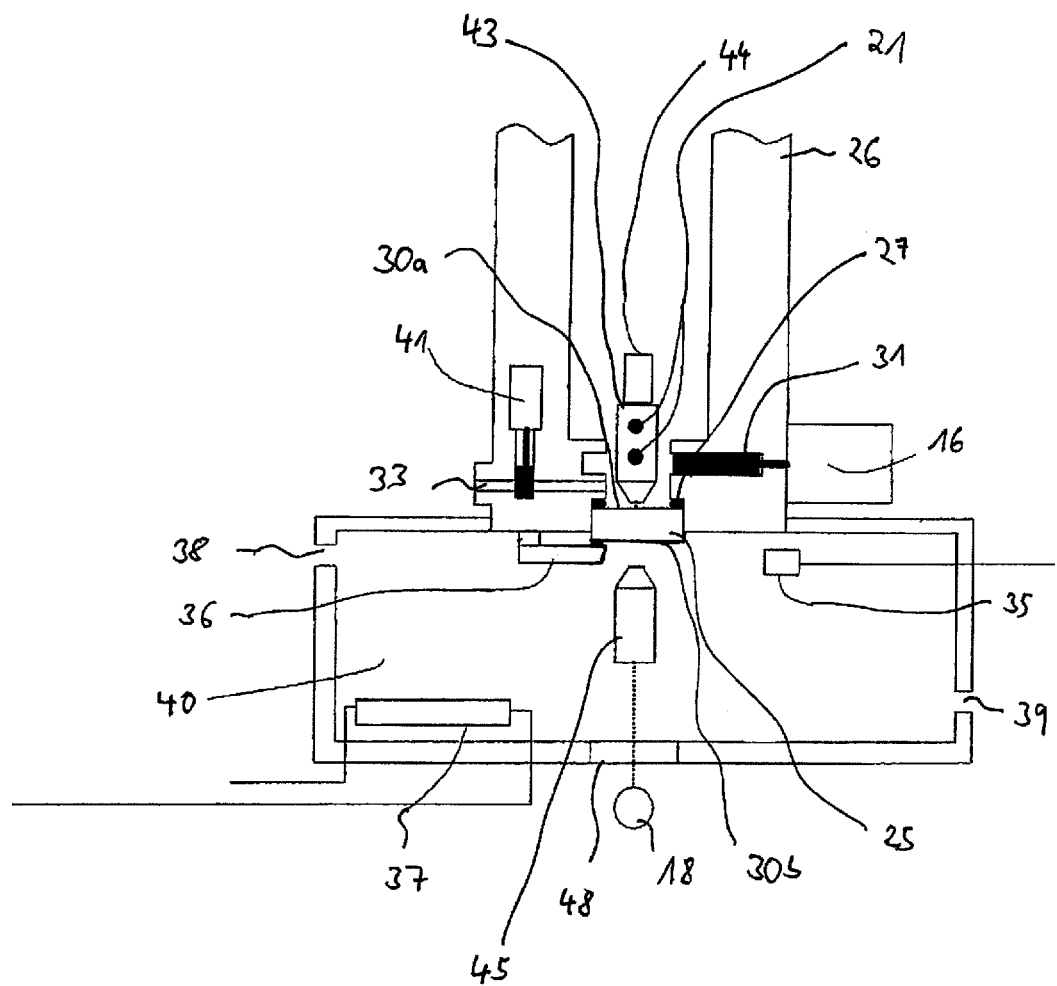
FIG. 9 shows a schematic view of a further embodiment of a combination of a particle beam device and an optical microscope.

FIG. 9 shows an almost identical embodiment according to FIG. 8. Identical components are marked with identical reference signs. In this embodiment, the microscope objective 43 is associated with a monitoring device 44 in the form of a camera. The connecting element 26 as shown in FIG. 9 can alternatively be a beam column 53, as described above.

Figure 10:
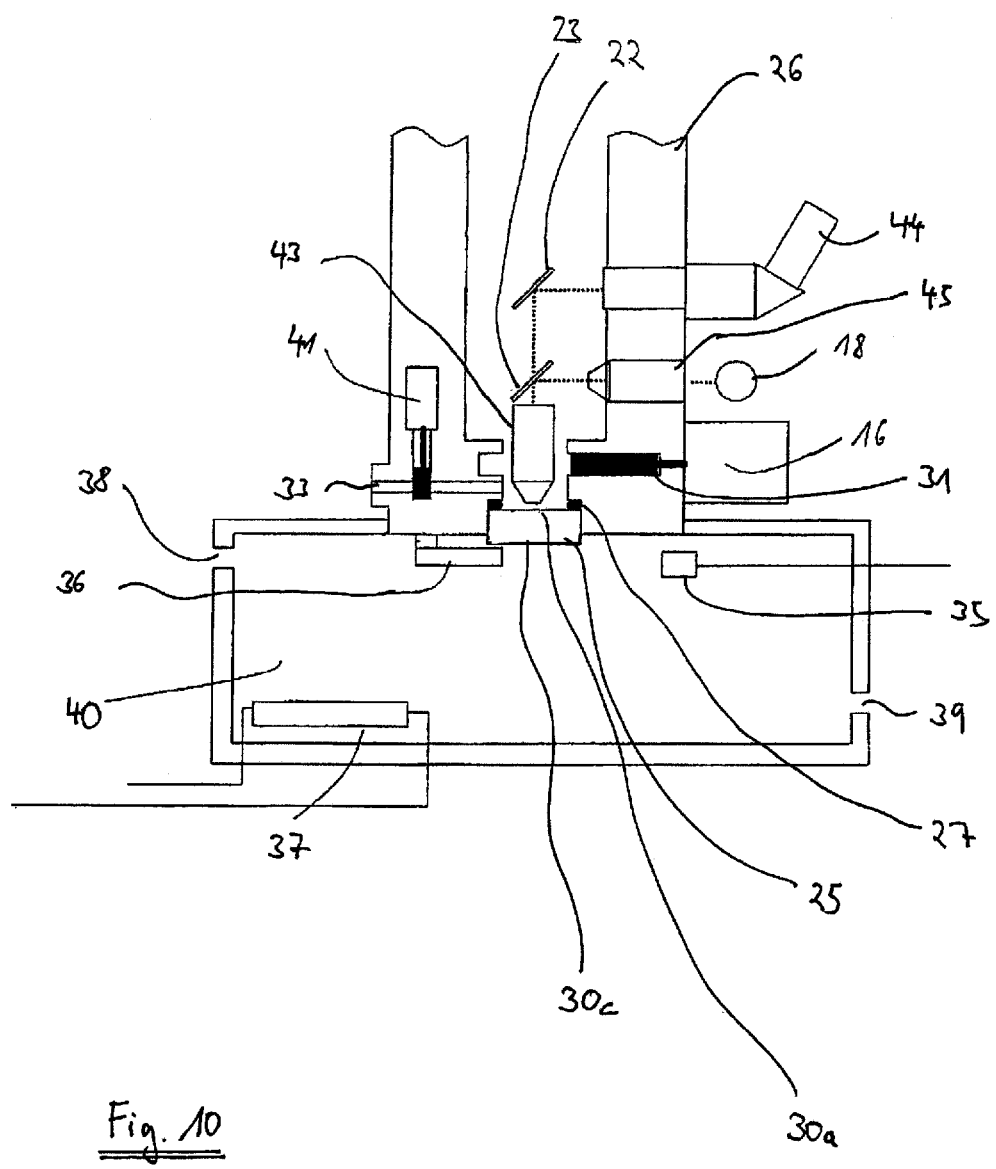
FIG. 10 shows a schematic view of another embodiment of a combination of a particle beam device and an optical microscope.

FIG. 10 shows an embodiment very similar to the embodiments of FIGS. 8 and 9. Identical components are marked with identical reference signs. However, this embodiment comprises an optical microscope completely arranged in the area of the connecting element 26. The optical microscope comprises a light source 18 associated with a microscope condenser 45 mounted into a wall of the connecting element 26. A mirror 23 directs light through the microscope objective 43 to the object positioned in the holding element 25. The light reflected by the object is guided through the microscope objective 43 via a mirror 22 to the monitoring device 44. The first membrane 30a of the holding element 25 is transparent for electrons and for light. The microscope objective 43 and the mirrors 22,23 can be tilted so that the primary electron beam can impinge the object in the holding element 25. The holding element 25 comprises a second membrane, namely the second membrane 30c so that a liquid or a gas might enter the interior of the holding element 25, thereby changing the surrounding conditions of the object.

The connecting element 26 as shown in FIG. 10 can alternatively be a beam column 53, as described above.

Figure 11:
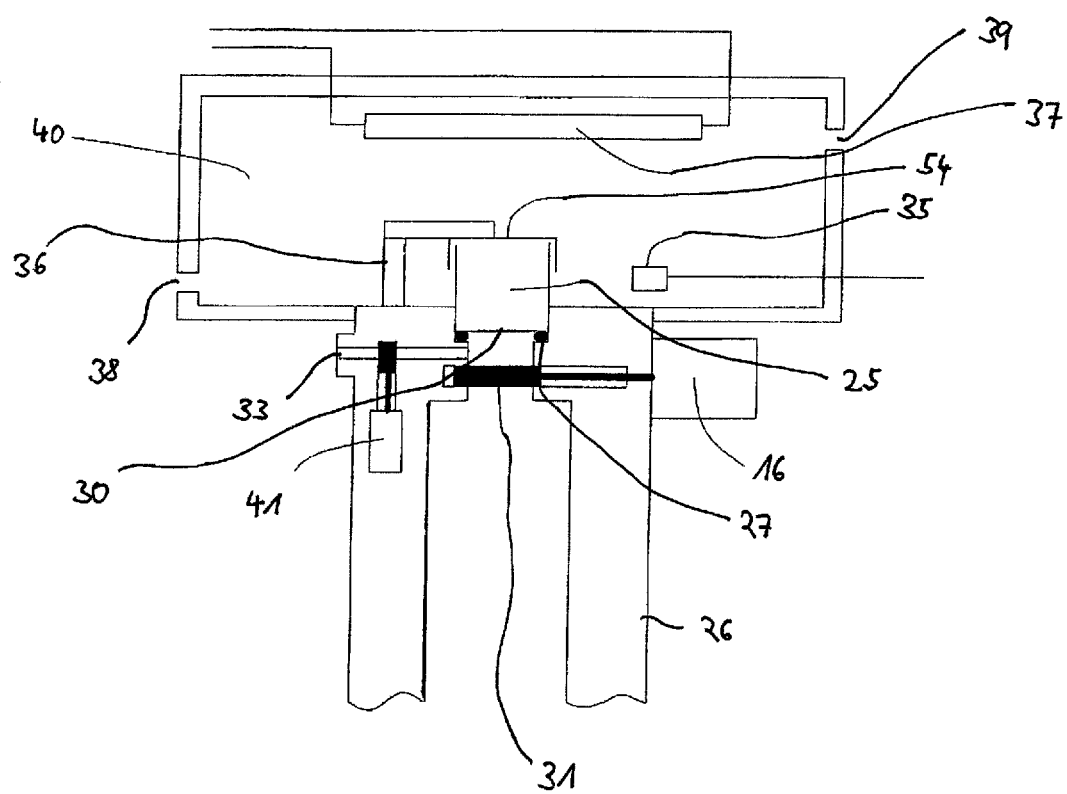
FIG. 11 shows a schematic partial view of a further particle beam device in the form of a scanning electron microscope.

FIG. 11 shows an embodiment very similar to the embodiment of FIG. 5. Identical components are marked with identical reference signs. However, this embodiment shows a so-called "inverse microscope". The scanning electron microscope is arranged on the ground and the holding element 25 and all further elements as shown are mounted on top of the connecting element 26. This embodiment is preferred for examinations of fluids and/or objects in a condition in which gravitation should not be altered. Moreover, this embodiment is preferred for examination of objects on which a nutrient solution is arranged.

The connecting element 26 as shown in FIG. 11 can alternatively be a beam column 53, as described above.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

The invention claimed is:

1. A beam device, comprising:
   at least one beam column having an optical axis;
   at least one beam generator that generates a beam and that is arranged in said beam column; and
   at least one objective lens that focuses said beam on an object arranged in a holding element and that is arranged in said beam column,
   wherein said beam column comprises a first extension perpendicular to said optical axis,
   wherein said holding element comprises a second extension perpendicular to said optical axis, said second extension being parallel to said first extension and shorter than said first extension, and
   wherein said holding element is arranged at a connecting element of said beam column and is removable from said connecting element, wherein the connecting element includes at least one valve.

2. A beam device, comprising:
   at least one beam generator that generates a beam; and
   at least one objective lens that focuses said beam on an object arranged in a holding element, wherein said objective lens comprises at least one connecting element, and wherein said holding element is connected to said connecting element so that said holding element is removable from said connecting element for modification of said object, wherein the connecting element includes at least one valve.

3. The beam device according to claim 1, wherein said beam column comprises a first outer surface and a second outer surface, said first extension being the distance between said first outer surface and said second outer surface, and wherein said holding element comprises a third outer surface and a fourth outer surface, said second extension being the distance between said third outer surface and said fourth outer surface.

4. The beam device according to claim 1, wherein said first extension is from about 150 mm to about 450 mm, and wherein said second extension is from about 10 mm to about 100 mm.

5. The beam device according to claim 1, further comprising:
a vacuum chamber in which said beam generator is arranged, and wherein said holding element is part of said vacuum chamber.

6. The beam device according to claim 1, wherein said connecting element comprises at least one of the following:
a flange for connecting said holding element to said connecting element; and
a quick release fastener for connecting said holding element to said connecting element.

7. The beam device according to claim 1, wherein at least one of said connecting element and said holding element comprises at least one sealing element.

8. The beam device according to claim 1, wherein said connecting element is formed integrally to said beam column.

9. The beam device according to claim 2, wherein said connecting element is formed integrally to said objective lens.

10. The beam device according to claim 1, wherein said connecting element further comprises:
an outlet connected to at least one pump.

11. The beam device according to claim 1, wherein said holding element is formed like a chamber comprising at least one aperture.

12. The beam device according to claim 11, wherein said aperture is sealed with at least one membrane being adapted to withstand pressure gradients resulting from the presence of a vacuum, and wherein an interior of said holding element is isolated from said vacuum by said membrane.

13. The beam device according to claim 12, wherein said membrane is removable from said holding element.

14. The beam device according to claim 12, wherein said membrane is transparent for at least one of the following: electrons, ions, and light.

15. The beam device according to claim 11, wherein said aperture has a diameter within the range of 0.1 mm to 4 mm.

16. The beam device according to claim 12, wherein said membrane comprises a thickness within the range of 50 Å to 6000 Å.

17. The beam device according to claim 12, wherein said membrane is formed of a material selected from the group consisting of: polymide, polyamide, polyamide-imide, polyethylene, polypyrrole, and conditional conducting polymers, Parlodion™, collodion, Kapton™, FormVar™, Vinylec™, ButVar™, Pioloform™, silicon dioxide, silicon monoxide and carbon.

18. The beam device according to claim 1, wherein said holding element is adapted to hold the interior of said holding element at substantially atmospheric pressure.

19. The beam device according to claim 12, wherein said object is positioned according to at least one of:
in said holding element in proximity to said membrane; and
in said holding element in contact with said membrane.

20. The beam device according to claim 1, further comprising:
a filling device that fills said holding element with at least one of the following: a gas and a liquid.

21. The beam device according to claim 1, further comprising:
an optical microscope for optical analysis of said object, wherein said optical microscope includes at least one microscope objective and at least one microscope condenser.

22. The beam device according to claim 21, wherein at least one of said microscope objective and said microscope condenser is moveable.

23. The beam device according to claim 22, wherein at least one of said microscope objective and said microscope condenser is adapted to be moved in one of the following positions: an analyzing position and a resting position.

24. The beam device according to claim 21, wherein at least one of said microscope objective and said microscope condenser comprises a pressure compensator.

25. The beam device according to claim 21, wherein at least one of said microscope objective and said microscope condenser comprises a first axis, and wherein an angle between said first axis and said optical axis is different from 0°.

26. The beam device according to claim 2, further comprising:
an optical microscope for optical analysis of said object, wherein said optical microscope includes at least one microscope objective and at least one microscope condenser, wherein at least one of said microscope objective and said microscope condenser comprises a first axis, wherein said beam device comprises a beam column having a second axis, and wherein an angle between said first axis and said second axis is different from 0°.

27. The beam device according to claim 1, wherein said beam device is at least one of: an electron beam device and an ion beam device.

28. A system, comprising:
a particle beam device having a beam generator that generates a beam, an objective lens that focuses the beam on an object, and at least one detector;
an optical microscope for optical analysis of said object; and
a holding element comprising said object and having at least one membrane adapted to withstand pressure gradients resulting from the presence of a vacuum and to isolate said object from said vacuum further comprising:
a filling device that fills said holding element with at least one of the following: a gas and a liquid.

29. The system according to claim 28, wherein said membrane is transparent for at least one of the following: electrons, ions, and light.

30. A system, comprising:
a particle beam device having a beam generator that generates a beam, an objective lens that focuses the beam on an object, and at least one detector;
an optical microscope for optical analysis of said object; and
a holding element comprising said object and having at least one membrane adapted to withstand pressure gradients resulting from the presence of a vacuum and to isolate said object from said vacuum, wherein said holding element comprises at least two membranes, namely a first membrane and a second membrane, wherein said first membrane is arranged at a first position on said holding element, and wherein said second membrane is arranged at a second position on said holding element.

31. The system according to claim 30, wherein said first membrane is transparent for particles, and wherein said second membrane is transparent for light.

32. The system according to claim 28, wherein said holding element comprises an aperture being sealed by said membrane.

33. The system according to claim 32, wherein said aperture comprises a diameter within the range of 0.1 mm to 4 mm.

34. The system according to claim 28, wherein said membrane comprises a thickness within the range of 50 Å to 6000 Å.

35. The system according to claim 28, wherein said membrane is formed of a material selected from the group consisting of: polymide, polyamide, polyamide-imide, polyethylene, polypyrrole, and conditional conducting polymers, Parlodion™, collodion, Kapton™, FormVar™, Vinylec™, ButVar™, Pioloform™, silicon dioxide, silicon monoxide and carbon.

36. The system according to claim 28, wherein said holding element is adapted to hold the interior of said holding element at substantially atmospheric pressure.

37. The system according to claim 28, wherein said object is positioned in said holding element in proximity to said membrane.

38. The system according to claim 28, wherein said object is positioned in said holding element in contact with said membrane.

39. The system according to claim 28, wherein said optical microscope comprises at least one microscope objective and at least one microscope condenser, said microscope objective and said microscope condenser being moveable.

40. The system according to claim 39, wherein at least one of said microscope objective and said microscope condenser is adapted to be moved in one of the following positions: an analyzing position and a resting position.

41. The system according to claim 39, wherein at least one of said microscope objective and said microscope condenser comprises a pressure compensator.

42. The system according to claim 39, wherein at least one of said microscope objective and said microscope condenser has a first axis, wherein said beam device comprises a beam column having a second axis, and wherein an angle between said first axis and said second axis is different from 0°.

43. The system according to claim 28, wherein said particle beam device is at least one of: an electron beam device and an ion beam device.

44. The beam device according to claim 2, wherein said beam device is at least one of: an electron beam device and an ion beam device.

* * * * *